(12) United States Patent  (10) Patent No.: US 7,722,364 B2
Klinger et al.  (45) Date of Patent: May 25, 2010

(54) HOLDER FOR A FLEXIBLE CIRCUIT BOARD

(75) Inventors: Herbert Klinger, Nuremberg (DE);
Gerhard Thomas, Fuerth (DE);
Norbert Hofmann, Erlangen (DE);
Martin Petrzik, Stein (DE); Joachim Delfs, Hemmingen (DE)

(73) Assignee: KNORR-BREMSE Systeme fuer Nutzfahrzeuge GmbH, Munich (DE)

( * ) Notice: Subject to any disclaimer, the term of this patent is extended or adjusted under 35 U.S.C. 154(b) by 0 days.

(21) Appl. No.: 12/188,842

(22) Filed: Aug. 8, 2008

(65) Prior Publication Data
US 2009/0061657 A1  Mar. 5, 2009

Related U.S. Application Data

(63) Continuation of application No. PCT/EP2007/000951, filed on Feb. 5, 2007.

(30) Foreign Application Priority Data
Feb. 9, 2006  (DE) .................. 10 2006 005 941

(51) Int. Cl.
*H01R 12/00* (2006.01)
(52) U.S. Cl. .......................................... 439/77; 439/83
(58) Field of Classification Search .................. 439/77, 439/83
See application file for complete search history.

(56) References Cited

U.S. PATENT DOCUMENTS

| 3,774,140 | A | | 11/1973 | Reimer |
| 5,148,962 | A | * | 9/1992 | Jones et al. ................ 228/49.1 |
| 5,669,775 | A | | 9/1997 | Campbell et al. |
| 5,810,613 | A | * | 9/1998 | Ati et al. ...................... 439/157 |
| 6,176,727 | B1 | * | 1/2001 | Liu et al. ..................... 439/358 |
| 6,356,450 | B1 | * | 3/2002 | Andreasen et al. .......... 361/759 |
| 6,500,018 | B1 | * | 12/2002 | Pfaffenberger et al. ...... 439/325 |
| 6,513,959 | B2 | | 2/2003 | Serizawa et al. |
| 7,217,148 | B1 | * | 5/2007 | Chen ........................... 439/326 |
| 2005/0266704 | A1 | | 12/2005 | Sudo et al. |

FOREIGN PATENT DOCUMENTS

| DE | 41 22 150 A1 | 1/1992 |
| DE | 100 61 866 | 7/2001 |
| DE | 100 61 866 | 7/2001 |
| DE | 102 15 536 A1 | 10/2003 |
| DE | 10 2004 061 472 A1 | 7/2006 |
| DE | 103 41 884 A1 | 4/2008 |

OTHER PUBLICATIONS

International Search Report dated Aug. 1, 2008 Two (2) pages.
International Preliminary Report on Patentability dated Feb. 5, 2007.

* cited by examiner

*Primary Examiner*—Briggitte R Hammond
(74) *Attorney, Agent, or Firm*—Crowell & Moring LLP

(57) ABSTRACT

A holder with a device for holding a flexible circuit board is provided. The holder comprises at least one further device for holding at least one component such that the component may be electrically connected to or disconnected from the circuit board.

14 Claims, 2 Drawing Sheets

HOLDER FOR A FLEXIBLE CIRCUIT BOARD

CROSS-REFERENCE TO RELATED APPLICATIONS

This application is a continuation of PCT International Application No. PCT/EP2007/000951, filed on Feb. 5, 2007, which claims priority under 35 U.S.C. §119 to German Application No. 10 2006 005 941.7, filed Feb. 9, 2006, the entire disclosures of which are expressly incorporated by reference herein.

BACKGROUND AND SUMMARY OF THE INVENTION

The present invention relates to a holder with a device for retaining a flexible circuit board.

Electrical connections between and within complex subassemblies are increasingly being realized using flexible circuit boards, also referred to as flexible foils. In comparison with electrical cable connections, these have a series of advantages. A flexible circuit board allows good movement of components of the subassemblies in relation to one another, in particular also during fitting. Furthermore, in comparison with conventional cables, a flexible circuit board takes up less space and, at the same time, can be subjected to relatively high mechanical loading. A flexible circuit board is used to connect, for example, various electronic components, such as sensors, actuators, etc., electrically to a control electronics unit. The prior art discloses various holders for connecting such electronic or mechatronic components electrically to the flexible circuit board and for retaining the flexible circuit board itself. For example, there are holders in existence which provide strain relief for the flexible circuit board during fitting and operation of mechanical and/or electronic components which can move in relation to one another.

The object of the invention is to provide a holder for flexible circuit boards which allows particularly straightforward and cost-effective fitting of the flexible circuit board and of the components connected thereto.

This object is achieved by the features of the independent claim.

Advantageous embodiments of the invention are given in the dependent claims.

The invention builds on the retaining means of the generic type for flexible circuit boards in that the holder has at least one further device for retaining at least one component, it being possible for the component to be connected to the flexible circuit board. It has proven to be advantageous to provide, on the holder for the flexible circuit board, retaining devices for further components which can be connected to the flexible circuit board. This reduces the number of retaining means during production and subsequent fitting, and the overall production costs decrease as a result. Furthermore, the component or the further components is/are already located in the immediate vicinity of the flexible circuit board to which they are to be connected. This reduces the necessary length of the connecting paths, makes it easier to arrange the components which are to be connected and reduces the number of additional connecting elements required between the circuit board and component.

In the case of a likewise preferred embodiment, it is provided that the component forms an electrical connection. This may be, for example, the electrical connection of a sensor, of an actuator or of other electrical components which are to be connected electrically to the flexible circuit board. It is thus possible, on the holder, for individual components of the subassemblies to be connected to the flexible circuit board itself by means of the component. It is thus possible for any mechanical or thermal loading which may occur during fitting or operation to be absorbed by the component, which, in comparison with the flexible circuit board, can usually be better equipped in this respect.

In the case of an alternative embodiment, it may be provided that the component forms an active element. A short connection between the element and the flexible circuit board is advantageous, in particular, in the case of active elements.

Moreover, it may advantageously be provided that the active element is a sensor. In particular sensors profit from particularly short connecting paths since often only low signal heights are present and/or undesirable interference signals may be impressed on the measuring signal as a result of long connecting paths.

In the case of a likewise preferred embodiment, it is provided that the sensor is a displacement, a speed and/or a temperature sensor. For example, it is possible for an active element comprising a combination of a speed sensor and a temperature sensor to be fastened on the holder and for the plug-in connection thereof to be connected to the flexible circuit board.

In the case of an advantageous embodiment, it may be provided that the component has a leadframe. It is thus possible, in particular, for leadframe ends of a sensor which have been secured by injection molding to be advantageously retained and positioned.

It may likewise advantageously be provided that the component has a strain relief device. Such a strain relief device may be advantageous in a number of application cases. For example, the flexible circuit board itself may require a strain relief device upon contact connection with an electronics unit. Furthermore, however, it is also the case that the further components which can be fastened on the holder are often connected to mechanically loaded components both during fitting and during operation. In this case, it is likewise possible to provide devices on the component which absorb tensile forces for example in cables, sheathed leadframe ends, etc.

Analogously, it may likewise be the case with an advantageous embodiment that the component provides an antikink means. It is preferably even possible to realize a strain relief device and antikink means in a single suitable form of the component.

Furthermore, in the case of a likewise preferred embodiment, it may be provided that the further device essentially secures the position of the component in relation to the holder. In particular in the case of components which can be electrically connected directly to the flexible circuit board, it is advantageous to secure the position of the second component relative to the holder, thus also relative to the flexible circuit board. This does away with the need for a further positioning step, which would be necessary according to the prior art. Furthermore, this results in a higher degree of reliability during operation of the subassembly as a whole since, in the case of a corresponding configuration of the holder, it is not possible for the position between the flexible circuit board and component to change.

A likewise advantageous embodiment provides that the connection between the component and the holder, the connection being created by means of the further device, is releasable. This is advantageous, in particular, in respect of fitting and/or repair.

In particular, a likewise advantageous embodiment provides that the further device is a latching device and/or plug-in device. This facilitates the installation of the component during fitting and/or repair or changeover work.

A further, likewise advantageous embodiment is characterized in that the component has a guide for electrical connections. This makes it possible to facilitate the handling of the component and the connections, in particular, during fitting and repair work.

The invention is based on the finding that, in a central retaining and/or carrying element, it is possible to combine in one part a number of functions which are usually performed by a number of separate parts. The central carrying element here performs the following functions: it retains and fixes a flexible circuit board, and it forms a strain relief device and an antikink means for the flexible circuit board upon contact connection with an electronics unit. Furthermore, the carrying element performs the functions of retaining and positioning connections, in particular a plug-in connection of a sensor, and feeds the flexible circuit board to this sensor. Furthermore, it is also possible for cable and leadframe connections of sensors to be retained and positioned on this carrying element.

Other objects, advantages and novel features of the present invention will become apparent from the following detailed description when considered in conjunction with the accompanying drawings.

DETAILED DESCRIPTION

In the following description of the drawings, like designations are used to designate like or comparable components.

Figure 1:
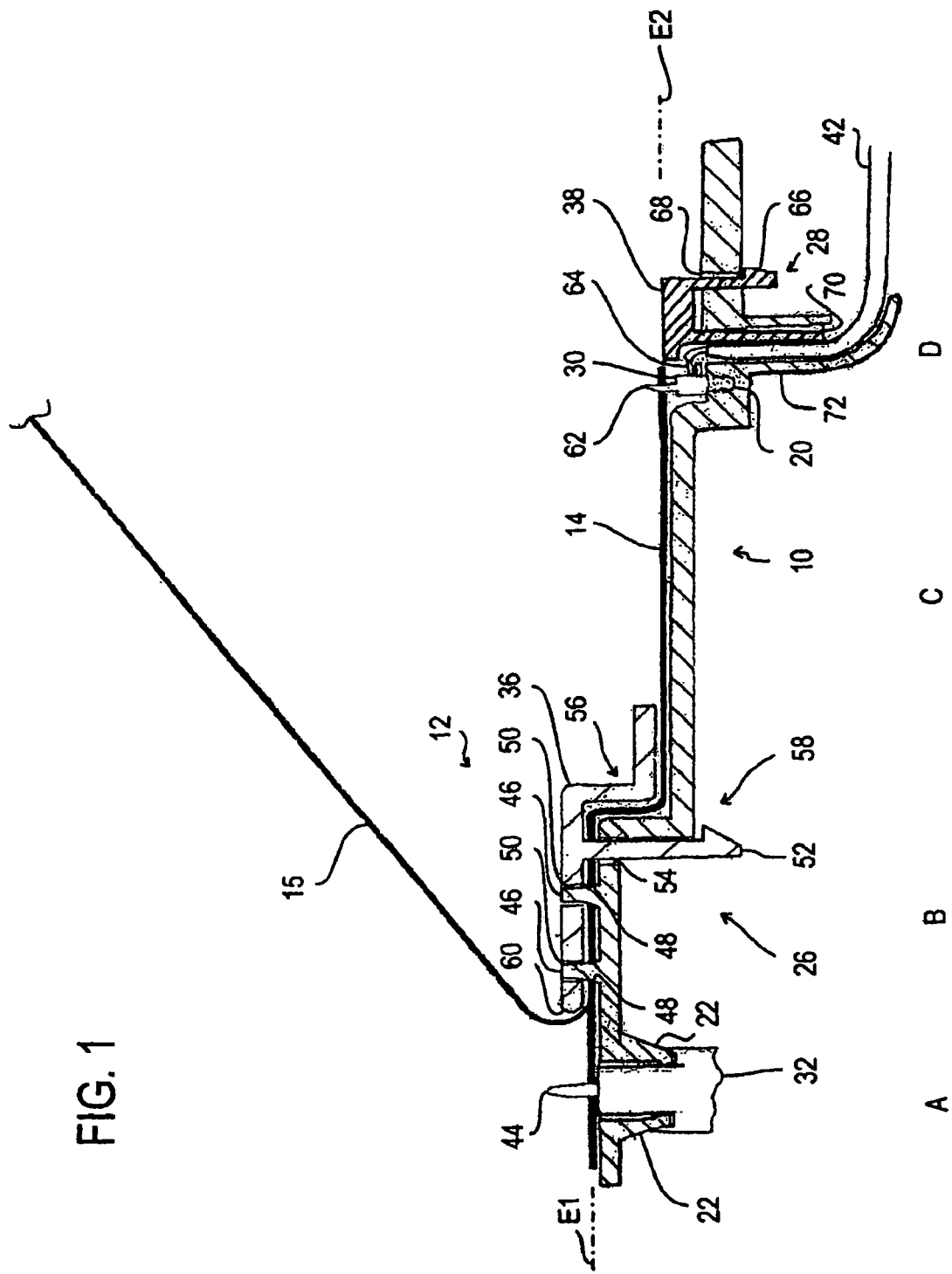
FIG. 1 shows a sectional view of a first preferred embodiment of the holder according to the invention.

FIG. 1 shows a sectional view of a first preferred embodiment of the holder 10 according to the invention. The central holder 10, which is produced from plastic, serves for retaining the flexible circuit board 14 and further components, as will be explained hereinbelow. The central plastic holder 10 can be subdivided, to facilitate explanation, into four portions A, B, C and D. In the portions A and B, the flexible circuit board 14 runs essentially in a first plane E1, whereas, in the portions C and D, it runs in a second, lower-level plane E2.

In portion A, the central plastic holder 10 has a sensor-retaining means 22. This sensor-retaining means 22 has introduced into it an active element 32, of which, for illustrative reasons, only a top part is depicted. The active element 32 is a combined speed and temperature sensor. The active element 32 has a contact pin 44 via which electrical contact connection can be produced between the active element 32 and the flexible circuit board 14.

In portion B, a strain relief device 26 is provided on the central plastic holder 10 as a constituent part of the retaining device 12 since, alongside its regions which run essentially parallel to the central plastic holder 10, the flexible circuit board 14 has a free region 15 which leads to an electronics unit (not depicted). The strain relief device 26 has protrusions 46 which engage in correspondingly configured apertures 48 in the flexible circuit board 14. A latching part 36 interacts with the strain relief device 26. This latching part 36 has apertures 50 which at least essentially correspond, in terms of diameter and arrangement, with the protrusions 46 of the strain relief device 26. The latching part 36 also has a latching nose 52, which engages in a through-passage 54 in the central plastic holder 10, and an antikink portion 60. As seen in cross section, the shape of the latching part 36 in its region 56 corresponds to the shape of the central plastic holder 10 in its region 58, i.e. the latching part 36 and central plastic carrier run largely parallel there.

When the flexible circuit board 14 is fitted onto the central plastic holder 10, the flexible circuit board 14 is aligned, by way of its apertures 48, in relation to the protrusions 46 and is fitted onto the central plastic carrier 10. The latching part 36 is then aligned, in respect of its apertures 50, with the protrusions 46. The latching nose 52 is then guided through the lead-through 54 and thus latched to the central plastic holder 10. The flexible circuit board 14 here is subjected to a pressure which extends over that entire surface of the flexible circuit board 14 which is covered by the latching part 46. On the one hand, this provides strain relief for any forces which may possibly arise at the free end 15 of the flexible circuit board 14. On the other hand, the course which the flexible circuit board 14 takes along the central plastic holder 10 is defined and this gives rise, in particular, to the flexible circuit board 14 changing from the plane E1 to the plane E2 on account of the interaction between the portion 56 of the latching part 36 and the region 58 of the central plastic holder 10. The suitably selected radius of curvature of the latching part 36 at the antikink portion 60 thereof, at the same time, counteracts any undesirable warping of the flexible circuit board 14 in the case of tensile forces which may possibly arise in the free region 15 of the flexible circuit board 14.

In the portion C, the flexible circuit board 14 is guided parallel to the central plastic holder 10, and it therefore connects the regions B and D.

In portion D, a plug-in depression 20 is provided in the central plastic holder 10. A transfer unit 30 can be introduced into this plug-in depression 20. This transfer unit has a contact pin 62 on its top side and lateral contact surfaces 64, to which a flex or a pin of an electromechanical component can be soldered. The transfer unit 30 can be introduced into the plug-in depression 20, and thus fastened therein, by way of its underside. This can be assisted, as depicted, for example in the case of an appropriately selected combination of materials, by suitable sawtooth-like outer contouring. A latching wedge 38 together with a cable-guiding device 28 of the central plastic holder 10 is also provided in portion D. In a manner analogous to the latching part 36, the latching wedge 38 has a latching nose 66, which can be introduced into the latching lead-through 68 and latched there. Moreover, the latching wedge 38 has a widening wedge-shaped portion 70. This interacts with a cable-guiding portion 72 of the central plastic holder 10. In this cable-guiding portion 72, for example, the sensor-connection cables 42 are guided to the transfer unit 30. Once the latching wedge 38, in particular the wedge-shaped portion 70, has been introduced into the cable-guiding device 28, the sensor-connection cables 42 are clamped within the cable-guiding portion 72, in which case the sensor-connection cables 42 are positioned and relieved of strain.

Figure 2:
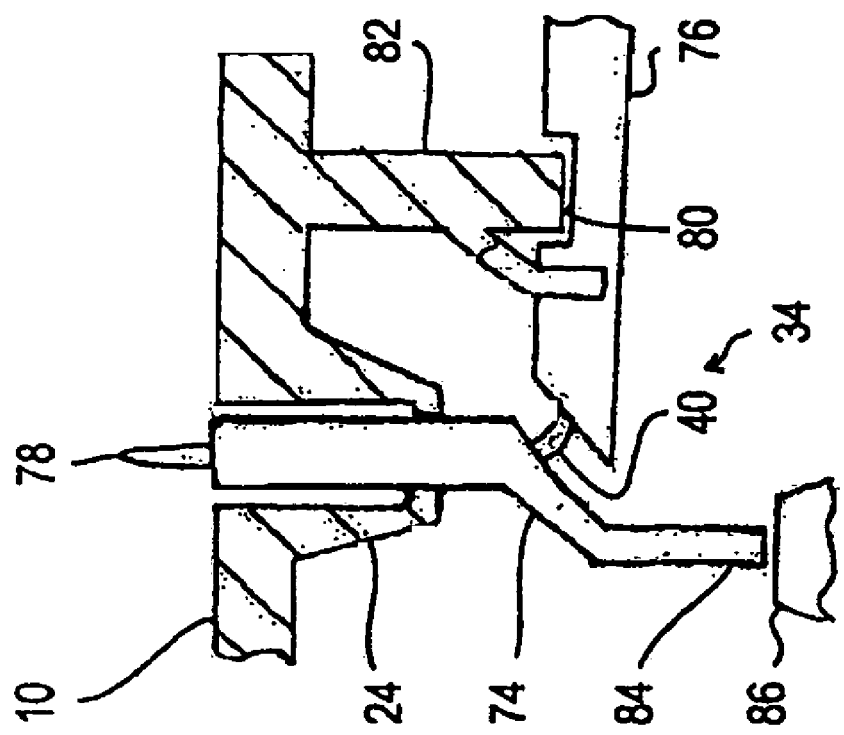
FIG. 2 shows a sectional view, in detail form, of a second, likewise preferred embodiment.

FIG. 2 shows a sectional view, in detail form, of a second, likewise preferred embodiment. In this sectional view, in detail form, an alternative embodiment of the central plastic holder 10 is illustrated for the portion D. Instead of the sensor connections being fed by means of a cable, as is depicted in FIG. 1, in this embodiment the sensor connections are supplied via a sheathed leadframe 34. The sheathed leadframe 34 comprises two sensor arms 74, 76, which are configured for movement in relation to one another via an exposed leadframe portion 40. The sensor arm 74, which is angled upward through ninety degrees during fitting, as is illustrated in FIG.

2, has a contact pin 78 which can be soldered to the flexible circuit board 14. The sensor arm 76, which remains horizontal, contains a groove 80 into which engages a plastic rib 82 of the central plastic holder 10 for the purposes of stabilizing and fixing the sensor arm 76. The leadframe end 74 is positioned and retained in a retaining means 24 of the central plastic holder 10. Furthermore, the leadframe end 74 additionally has a supporting portion 84, which rests on a bearing means 86 on a diecast bottom part, which is only partially indicated in FIG. 2. This supporting portion 84 additionally positions the sheathed sensor connection 34 and supports the same. It is also possible for further bearing means to be provided on the horizontal sensor arm 76.

Those features of the invention which are disclosed in the above description, in the drawings and in the claims may be essential both individually and in any desired combination for the purpose of realizing the invention.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF DESIGNATIONS 10 central plastic holder
12 retaining device
14 flexible circuit board
15 free end of the flexible circuit board
20 plug-in depression
22 sensor mount
24 leadframe-end retaining means
26 strain relief device
28 cable-guiding device
30 transfer unit
32 active element
34 sensor leadframe
36 latching part
38 latching wedge
40 exposed leadframe portion
42 sensor-connection cable
44 contact pin
46 protrusions
48 apertures in flexible circuit board
50 apertures in latching part
52 latching nose
54 latching lead-through
56 plane-changeover region
58 plane-changeover region
60 antikink portion
62 transfer-unit contact pin
64 soldering contact surface
66 latching nose
68 latching lead-through
70 wedge-shaped portion
72 cable guide
74 leadframe end
76 horizontal sensor arm
78 contact pin
80 groove
82 plastic rib
84 supporting portion
86 bearing means
A, B, C, D portions of the central plastic holder
E1, E2 planes of the flexible circuit board

What is claimed is:

1. A flexible circuit board holder, comprising:
a holder, the holder including at least one component and a device for retaining a flexible circuit board, wherein
the holder has at least one further device for retaining at least one component,
the at least one component is connectable electrically to the flexible circuit board,
a bearing surface of the holder is configured to receive the flexible circuit board thereon,
the further device and the at least one component are located on the same side of the circuit board as the bearing surface of the holder,
the at least one component is located between the circuit board and the bearing surface of the holder, and
the at least one component has a plug-in connection to be connected to flexible circuit board.

2. The flexible circuit board holder as claimed in claim 1, wherein the at least one component forms an electrical connection.

3. The flexible circuit board holder as claimed in claim 2, wherein the at least one component forms an active element.

4. The flexible circuit board holder as claimed in claim 3, wherein the active element is a sensor.

5. The flexible circuit board holder as claimed in claim 4, wherein the sensor is at least one of a displacement sensor, a speed sensor and a temperature sensor.

6. The flexible circuit board holder as claimed in claim 5, wherein the at least one component has a leadframe.

7. The flexible circuit board holder as claimed in claim 6, further comprising:
a strain relief component having a strain relief device.

8. The flexible circuit board holder as claimed in claim 7, wherein the strain relief component includes a flexible circuit board antikink feature.

9. The flexible circuit board holder as claimed in claim 1, wherein the further device secures the position of the at least one component in relation to the holder.

10. The flexible circuit board holder as claimed in claim 8, wherein the further device secures the position of the at least one component in relation to the holder.

11. The flexible circuit board holder as claimed in claim 1, wherein the at least one component and the holder are releasably connected by the further device.

12. The flexible circuit board holder as claimed in claim 11, wherein the further device is at least one of a latching device and a plug-in device.

13. The flexible circuit board holder as claimed in claim 12, wherein the further device has a guide for electrical connections.

14. The flexible circuit board holder as claimed in claim 13, wherein the at least one component has a guide for electrical connections.

* * * * *